United States Patent

Taguchi et al.

Patent Number: 5,998,907
Date of Patent: Dec. 7, 1999

[54] SURFACE ACOUSTIC WAVE DEVICES AND THEIR MANUFACTURING METHOD

[75] Inventors: Yutaka Taguchi, Takatsuki; Kazuo Eda, Nara; Osamu Kawasaki, Kyotanabe; Yosihiro Tomita, Osaka; Keiji Onishi, Settsu; Shun-ichi Seki, Amagasaki; Akihiko Namba, Osaka; Hiroki Sato, Moriguchi; Tetsuyosi Ogura, Settsu, all of Japan

[73] Assignee: Matsushita Electric Industrial Co., Ltd., Osaka, Japan

[21] Appl. No.: 09/087,079

[22] Filed: May 29, 1998

[30] Foreign Application Priority Data

Jun. 2, 1997 [JP] Japan .................................. 9-143599
Sep. 24, 1997 [JP] Japan .................................. 9-259104

[51] Int. Cl.$^6$ ...................................................... H03H 9/64
[52] U.S. Cl. ........................................ 310/313 R; 310/357
[58] Field of Search ........................... 310/313 A, 313 R, 310/357

[56] References Cited

U.S. PATENT DOCUMENTS

| | | | |
|---|---|---|---|
| 3,943,389 | 3/1976 | Hickernell et al. | 310/313 R |
| 4,562,371 | 12/1985 | Asai et al. | 310/313 A |
| 5,440,189 | 8/1995 | Nakahata et al. | 310/313 R |
| 5,446,330 | 8/1995 | Eda et al. | 310/313 R |
| 5,698,471 | 12/1997 | Namba et al. | 437/225 |
| 5,747,857 | 5/1998 | Eda et al. | 310/313 R |
| 5,771,555 | 6/1998 | Eda et al. | 310/344 |
| 5,852,702 | 12/1998 | Nishida et al. | 385/130 |

OTHER PUBLICATIONS

"Temperature–Compensation Surface Acoustic–Wave Devices with $SiO_2$ Film Overlays," by T. E. Parker, et al., *J. Appl. Phys.*, vol. 50, pp. 1360–1369, American Institute of Physics, 1979.

"SAW Properties of $SiO_2/128°$ Y–X $LiNbO_3$ Structure Fabricated by Magnetron Sputtering Technique," by Kazuhiko Yamanouchi, et al., pp. 51–57, *IEEE Transactions on Sonics and Ultrasonics*, vol. SU–31, No. 1, Jan. 1984.

"Effect of a Ferroelectric Inversion Layer on the Temperature Characteristics of SH–Type Surface Acoustic Waves on 36° Y–X $LiTaO_3$ Substrates," by Kiyoshi Nakamura, et al., *IEEE Transactions on Ultrasonic, Ferroelectrics, and Frequency Control*, vol. 41, pp. 872–875, Nov. 1994.

*Primary Examiner*—Thomas M. Dougherty
*Attorney, Agent, or Firm*—Smith, Gambrell & Russell, LLP

[57] ABSTRACT

A surface acoustic wave device has a main substrate; a comb-like electrode formed on one of the main surfaces of said main substrate; and a supplementary substrate joined with the other main surface of said main substrate, wherein said supplementary substrate has a smaller thermal expansion coefficient and a larger thickness than said main substrate.

11 Claims, 7 Drawing Sheets

SURFACE ACOUSTIC WAVE DEVICES AND THEIR MANUFACTURING METHOD

BACKGROUND OF THE INVENTION

1. Field of the Invention

The present invention relates to surface acoustic wave devices used for mobile communication equipment and their manufacturing method.

2. Related Art of the Invention

Due to the development of mobile communication, there is a growing demand for the improvement of the performance of surface acoustic wave devices that are one of the key devices in manufacturing equipment. The characteristics of surface acoustic wave devices depend on the electromechanical coupling coefficient, delay time temperature coefficient, and surface acoustic wave propagation velocity of piezoelectric substrates. Common piezoelectric substrates are now formed of piezoelectric monocrystal such as crystal, lithium tantalate, or lithium niobate. Due to the anisotropy of the piezoelectric monocrystal, substrates of the same material may have different characteristics depending on their cut angle or propagating direction. Thus, such substrates are selected depending on their applications. In general, the temperature coefficient of frequency (TCF) of these piezoelectric substrates increases with increasing electromechanical coupling coefficient, while it decreases with decreasing TCF, and substrate materials have been required that have a large electromechanical coupling coefficient and a small TCF.

In addition, various mobile communication systems are used and the working frequency band has spread from a conventional 800-MHz band to a 1.9-GHz band. The PCS system in the U.S. and the PCN system in Europe are mobile communication systems that use the 1.9-GHz band and that have a very small difference in frequency (20 MHz) between the transmission and reception bands. Thus, if, for example, a transmission filter is used, it is very difficult to achieve sufficient attenuation in the reception band. When a surface acoustic wave filter is used for these systems, piezoelectric substrates formed of lithium tantalate or niobate having a large electromechanical coupling coefficient are normally used in order to provide a pass band. Due to the large TCF of such piezoelectric substrates (for example, about −35 ppm/° C. in lithium tantalate for 36° Y-cut and X propagation), however, only 10-odd MHz of interval can be substantially provided between the transmission and reception bands taking the operating temperature range and manufacturing deviances into consideration. Consequently, in the above example of a transmission filter, it is further difficult to achieve sufficient attenuation in the reception band. These factors further enhance a demand for piezoelectric substrates having a large electromechanical coupling coefficient and excellent temperature characteristics.

Various approaches have been executed to improve the TCF of surface acoustic wave devices. For example, (1) the well known methods disclosed in J. Appl. Phys. (Vol. 50, pp. 1360–1369, 1979) and IEEE Transactions Sonics and Ultrasonics (Vol. SU-31, pp. 51–57, 1984) improve the TCF of surface acoustic wave devices by forming on lithium tantalate or niobate a silicon oxide film ($SiO_2$) of a TCF with an opposite sign. (2) In addition, the method disclosed in IEEE Transactions Ultrasonics, Ferroelectrics, and Frequency Control (Vol. 41, pp. 872–875, 1994) forms a polarization inverting layer on the surface of a piezoelectric substrate to allow the electrostatic short-circuit effect of the piezoelectric to be used to control the TCF of a surface acoustic wave device. (3) A method has also been proposed that directly joins different piezoelectric substrates together to provide a piezoelectric substrate having new piezoelectric characteristics.

Conventional surface acoustic wave devices are described below.

Figure 9:
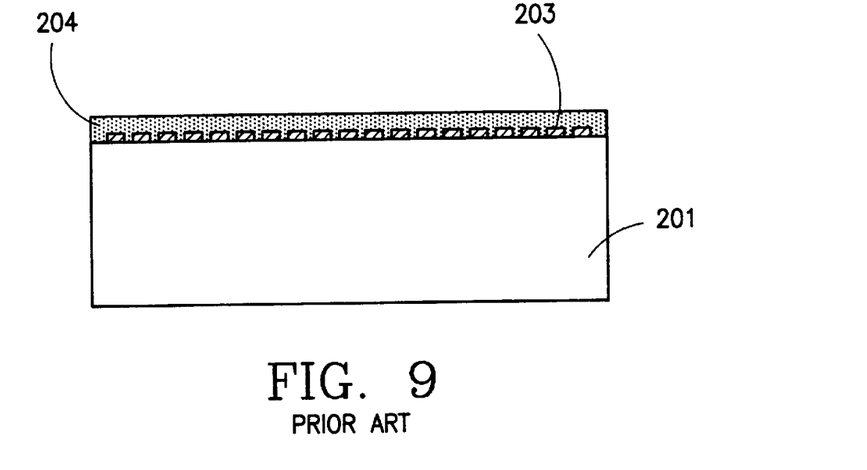
FIG. 9 is a sectional view schematically showing a structure of a conventional surface acoustic wave device.

First, a conventional surface acoustic wave device is described in which a silicon oxide film is formed on an existing piezoelectric substrate. FIG. 9 is a sectional view of a conventional surface acoustic wave device in which a silicon oxide film is formed on a piezoelectric substrate. In this figure, 201 is a piezoelectric substrate, 203 is a comb-like electrode, and 204 is a silicon oxide film. The piezoelectric substrate 201 comprises lithium tantalate or niobate. This surface acoustic wave device is fabricated by forming the comb-like electrode 203 on the piezoelectric substrate 201, and using a sputtering method to form the silicon oxide film 204 on the piezoelectric substrate 201 on which the comb-like electrode 203 is formed. The piezoelectric characteristics vary depending on the thickness of silicon oxide, and a zero temperature coefficient is obtained at a certain thickness (normally expressed by normalizing the surface acoustic wavelength).

Figure 10:
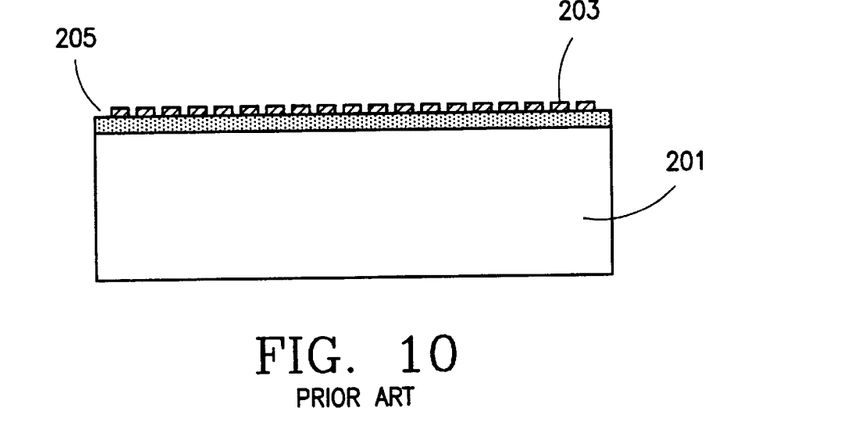
FIG. 10 is a sectional view schematically showing another structure of a conventional surface acoustic wave device.

Next, a conventional surface acoustic wave device is discussed in which a polarization inverting layer is formed on the surface of a piezoelectric substrate. FIG. 10 is a sectional view of a conventional surface acoustic wave device in which a polarization inverting layer is formed on the surface of a piezoelectric substrate. In this figure, 201 is the piezoelectric substrate, 203 is the comb-like electrode, and 205 is a polarization inverting layer. This surface acoustic wave device is fabricated by forming the polarization inverting layer 205 on the front surface of the piezoelectric substrate 201 and then forming the comb-like electrode 203. When the polarization inverting layer 205 has a certain depth, the electrostatic short-circuit effect of this layer 205 improves its temperature characteristics compared to existing piezoelectric substrates.

Figure 11:
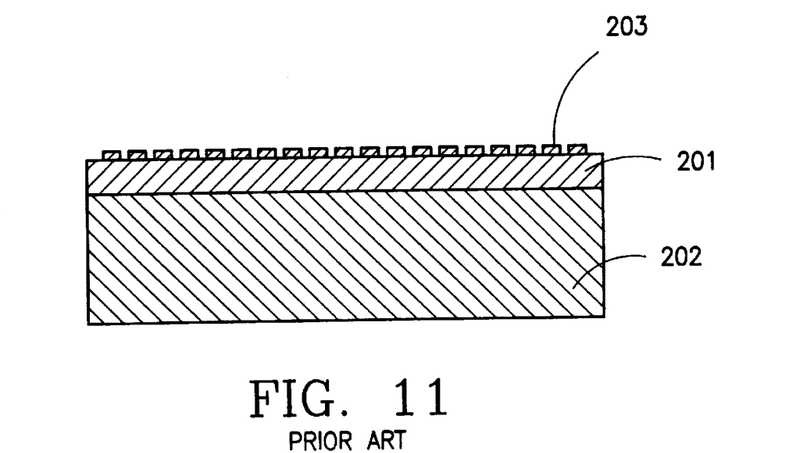
FIG. 11 is a sectional view schematically showing yet another structure of a conventional surface acoustic wave device.

In addition, FIG. 11 is a sectional view showing a configuration of a conventional surface acoustic wave device wherein piezoelectric monocrystals are directly joined together to provide new piezoelectric characteristics. In this figure, 201 is a main substrate consisting of a first piezoelectric substrate, 202 is a supplementary substrate consisting of a second piezoelectric substrate, and 203 is a comb-like electrode. According to this configuration, a surface acoustic wave device with new characteristics is provided by reducing the thickness of the main substrate 201 below one surface acoustic wavelength to excite a surface acoustic wave in a mode different from that of a surface acoustic wave that propagates along the main substrate.

These conventional surface acoustic wave devices, however, have the following problems.

First, while the silicon oxide film or polarization inverting layer can improve the temperature characteristics, the characteristics of the piezoelectric substrate inevitably change. That is, the surface acoustic wave velocity may vary, the propagation loss of surface acoustic waves may increase, the electromechanical coupling coefficient may vary, or unwanted spurious responses may occur. Furthermore, if the silicon oxide film is used, the varying thickness of this film may cause the piezoelectric characteristics and surface acoustic wave velocity of the piezoelectric substrate to vary, thereby hindering manufacturing deviances from being controlled. The film quality of silicon oxide may cause the characteristics of the substrate to change. Similarly, if the polarization inverting layer is used, varying the depth of the polarization inverting layer may cause the piezoelectric characteristics and surface acoustic wave velocity of the piezoelectric substrate to change.

On the other hand, the conventional surface acoustic wave device using a direct junction requires the thickness of the first piezoelectric substrate, that is, the main substrate to be reduced accurately, thereby preventing high frequencies from being used for the process.

SUMMARY OF THE INVENTION

In view of the difficulty in controlling the temperature characteristics of such conventional piezoelectric substrates for surface acoustic waves, the present invention provides a surface acoustic wave device having excellent temperature characteristics and manufacturing methods that do not change the characteristics of the piezoelectric substrate such as the electromechanical coupling coefficient or surface acoustic wave velocity.

To solve the problems described above, the present invention according to a first aspect is a surface acoustic wave device comprising a main substrate; a comb-like electrode formed on one of the main surfaces of said main substrate; and a supplementary substrate joined with the other main surface of said main substrate, wherein said supplementary substrate has a smaller thermal expansion coefficient and a larger thickness than said main substrate.

The present invention according to a second aspect is a surface acoustic wave device comprising a main substrate; a comb-like electrode formed on one of the main surfaces of said main substrate; and a supplementary substrate joined with the other main surface of said main substrate, wherein said supplementary substrate has a larger thermal expansion coefficient and a smaller thickness than said main substrate.

The present invention according to a third aspect is a surface acoustic wave device manufacturing method comprising a hydrophilic treatment step of washing a main substrate and a supplementary substrate to make them hydrophilic; a direct joining step of directly joining said main and supplementary substrates after said hydrophilic treatment; and an electrode forming step of forming a comb-like electrode on said main substrate after said direct joining step, wherein said supplementary substrate has a smaller thermal expansion coefficient and a larger thickness than said main substrate.

The present invention according to a fourth aspect is a surface acoustic wave device manufacturing method comprising a hydrophilic treatment step of washing a main substrate and a supplementary substrate to make them hydrophilic; a direct joining step of directly joining said main and supplementary substrates after said hydrophilic treatment; and an electrode forming step of forming a comb-like electrode on said main substrate after said direct joining step, wherein said supplementary substrate has a larger thermal expansion coefficient and a smaller thickness than said main substrate.

Description of Symbols

101 Main substrate
102 Supplementary substrate
103 Comb-like electrode
104 Silicon oxide film
105 Polarization inverting layer
106 Conductive film
107 Insulating film
108 Groove portion
109 Cut line
111 Main substrate material
112 Supplementary substrate material

PREFERRED EMBODIMENTS

Embodiments of this invention are described below with reference to the drawings.
(First embodiment)

Figure 1A:
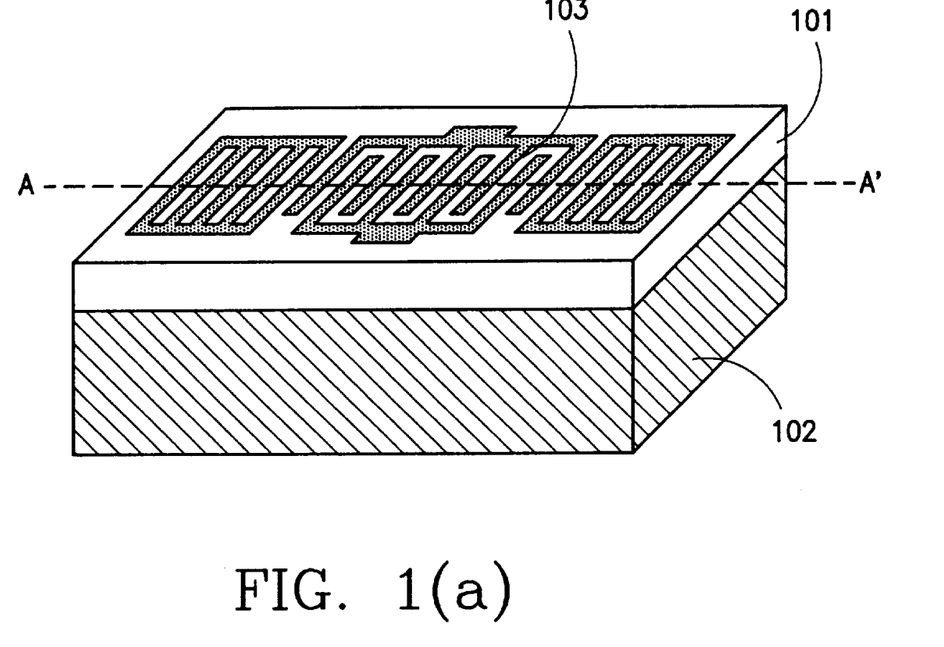
FIGS. 1(a) and 1(b) show a perspective and a sectional views of a surface acoustic wave device according to a first embodiment of this invention.
Figure 1B:
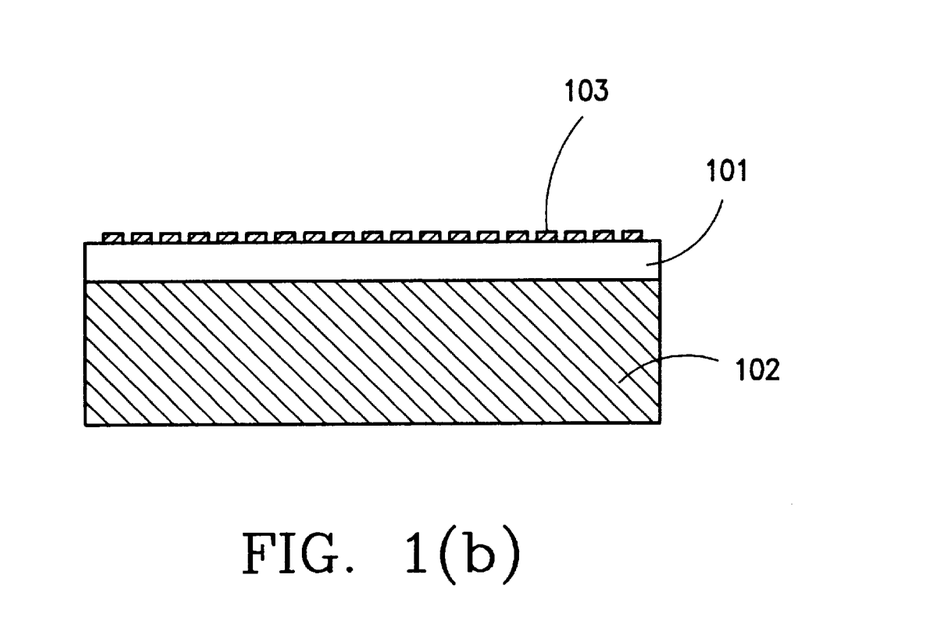

FIG. 1 schematically shows a configuration of a surface acoustic wave device according to a first embodiment of this invention. FIG. 1(a) is a schematic perspective view, and FIG. 1(b) is a sectional view taken along line A—A' in FIG. 1(a). In FIG. 1, 101 is a main substrate, 102 is a supplementary substrate, and 103 is a comb-like electrode. According to this embodiment, the main substrate 101 comprises 36° Y-cut X-propagating lithium tantalate of thickness 100 $\mu$m, and the supplementary substrate 102 comprises a low-thermal-expansion glass substrate of thickness 300 $\mu$m. The thickness of the main substrate 101 is set equal to 10 wavelegnths and is thus sufficiently large compared with the surface acoustic wavelength. The thermal expansion coefficient of the lithium tantalate substrate is 16 ppm/°C. (surface acoustic wave propagating direction), and the thermal expansion coefficient of the glass substrate is 4.5 ppm/°C. That is, the glass substrate has a smaller thermal expansion coefficient than the lithium tantalate substrate.

A method for manufacturing a surface acoustic wave device according to an embodiment of this invention is described below with reference to the drawings.

First, the direct junction of the main substrate 101 and the supplementary substrate 102 is described. The main and supplementary substrates 101 and 102 that have been mirror-finished are prepared. Then, both substrates are sufficiently washed to remove dust and organic substances therefrom. Both substrates are immersed in a mixed solution of ammonium hydroxide and hydrogen peroxide to make their surfaces hydrophilic. Both substrates are sufficiently rinsed with pure water to terminate their surfaces with a hydroxyl group. Then, both substrates are joined at on their respective main surfaces. Initially, they are mutually joined via water, but the moisture is gradually removed to change their junction to one provided by the inter-molecular force of the hydroxyl group, oxygen, and hydrogen, thereby firmly joining the main and supplementary substrates 101 and 102 together (initial junction).

Then, both substrates that are initially joined together are thermally treated. Although a certain junction strength can be obtained by leaving the substrates under the room temperature, they are thermally treated at 100° C. or higher for several tens of minutes to several tens of hours in order to increase a junction strength. If there is a large difference between the thermal expansion coefficients of the substrates as in this embodiment, an upper limit must be set for the thermal treatment temperature depending on the size of both substrates (the junction area). This is because the increase in temperature may cause the initially joined substrates to be warped and because an excessive increase in temperature may cause the substrates to be cracked. Conversely speaking, the establishment of the initial junction is proved by the fact that the excessive increase in temperature causes the substrates to be cracked. In this manner, when heated below the upper limit, the initially joined substrates have a sufficient junction strength and do not slide during the thermal treatment, providing a joined body without residual stress under the room temperature after the thermal treatment.

Then, a normal photolithography technique is used to form the comb-like electrode 103 on the main-substrate-side surface of the joined body obtained. During this process, the substrates may warp during a heating process such as the prebaking of a photoresist, so the temperature distribution on the surface of the substrate will be wide if a hot plate is used. Thus, an oven is preferably used during the thermal treatment. The surface acoustic wave device according to this embodiment is manufactured via the above process.

Next, the temperature characteristics of the surface acoustic wave device are described. The TCF of the surface acoustic wave device is approximately given as the difference between the temperature coefficient of velocity (TCV) of the surface acoustic wave and the thermal expansion coefficient ($\alpha$) of the device substrate. In addition, the TCV depends on the thermal variation of the elastic constant of the substrate and the thermal variation of its density. Tight-coupling substrates of lithium tantalate or niobate have a negative TCV (the surface acoustic wave propagation velocity decreases with increasing temperature).

With respect to the TCV of the junction substrate used in the surface acoustic wave device according to this embodiment, the nature of the supplementary substrate is negligible because the thickness of the main substrate 101 is larger than or equal to one surface acoustic wavelength. Consequently, only the elastic constant and density of the main substrate must be mainly taken into consideration. Since, however, the density is a function of the thermal expansion coefficient of the surface of the substrate, distortion caused by thermal stress caused by the difference in thermal expansion coefficient between the main substrate and the supplementary substrate 102 must be taken into consideration. In addition, the variation of the elastic constant caused by the distortion must be taken into consideration.

This embodiment directly joins the main substrate 101 of a large thermal expansion coefficient with the supplementary substrate 102 of a larger thickness and a smaller thermal expansion coefficient than the main substrate. Thus, compression stress acts near the surface of the main substrate due to a positive temperature variation, and the thermal expansion coefficient of the main substrate and the variation of its density are smaller than its inherent ones. As a result, the variation of the TCV and of the linear expansion coefficient in the surface acoustic wave propagating direction are small, and the TCF of the surface acoustic wave device is improved.

Figure 2:
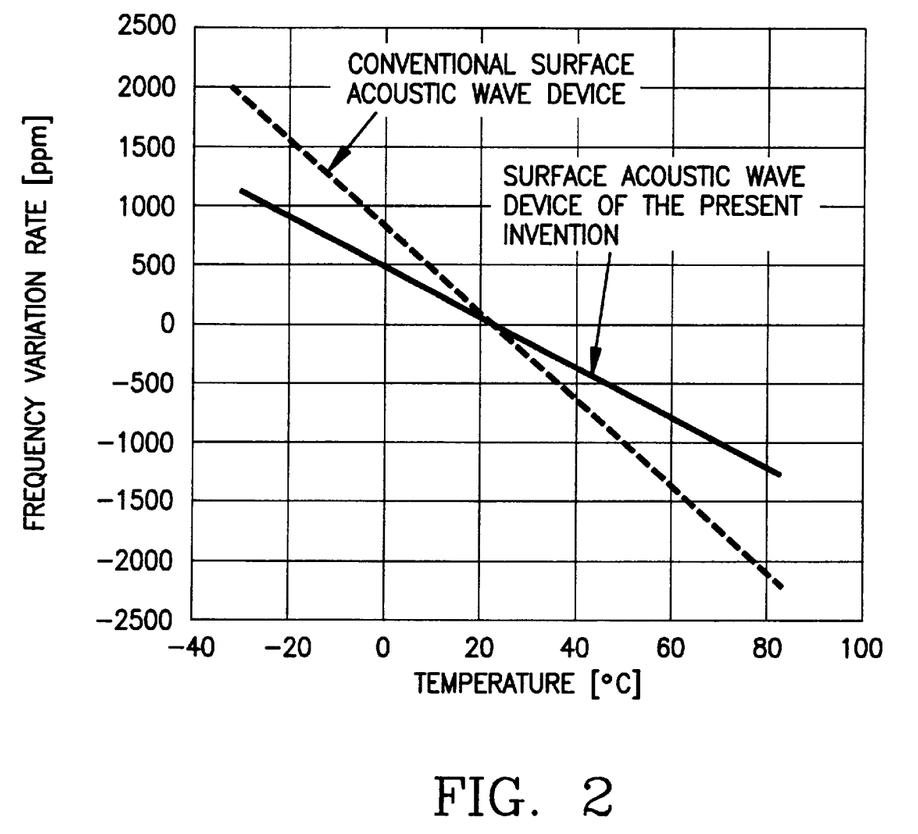
FIG. 2 shows the dependence on the temperature of the frequency of the surface acoustic wave device according to the first embodiment of this invention.

FIG. 2 shows thermal variations in the frequency of the surface acoustic wave device according to this embodiment. This figure shows the results of the use of a one-port resonator of resonance frequency 500 MHz as a surface acoustic wave device. As shown in the figure, the TCF of the surface acoustic wave device according to this embodiment is significantly improved; it is $-20$ ppm/°C. whereas the TCF of the conventional 36° Y-cut X-propagating lithium tantalate is $-35$ ppm/°C.

As described above, this embodiment provides a surface acoustic wave device having excellent temperature characteristics without changing its characteristics such as the electromechanical coupling coefficient and surface acoustic wave propagation velocity.

Although this embodiment uses the 36° Y-cut X-propagating lithium tantalate as the main substrate, it is not limited to this aspect, and similar effects can be obtained with another cut angle by using a supplementary substrate having a smaller thermal expansion coefficient than the main substrate. In addition, even if the thermal expansion coefficients of both substrates are equivalent in the surface acoustic wave propagating direction, the density variation can be prevented to improve the TCF by setting the thermal expansion coefficient of the supplementary substrate smaller than that of the main substrate in the direction perpendicular to the surface acoustic wave propagating direction. The degree of the improvement, however, is low because only the TCV contributes to this effect. In addition, similar effects can be obtained by using lithium niobate, Langasite ($La_3Ga_5S:O_{14}$), or lithium borate for the main substrate.

In addition, although this embodiment sets the thickness of the main substrate about ten times as large as the surface acoustic wavelength, it is not limited to this aspect, and the temperature characteristics of the surface acoustic wave device can be improved without affecting its characteristics as long as the thickness is larger than or equal to about one wavelength in which the particle displacement of the surface acoustic wave concentrates. Thus, according to this embodiment, the main substrate can be subjected to processing such as polishing from one of the main surfaces of the directly joined main substrates to reduce its thickness in order to increase the effect of the stress of the supplementary substrate, thereby further improving the temperature characteristics.

In addition, although this embodiment uses glass as the supplementary substrate, it is not limited to this aspect, and a different low-thermal-expansion material such as silicon may be used. If glass is used as the supplementary substrate, it can be joined easily with the main monocrystal substrate due to its amorphousness. In addition, the composition of glass enables materials of various mechanical properties to be obtained to allow the temperature characteristics to be controlled easily. If a conductor is used as the supplementary substrate, it can restrain, for example, the pyroelectricity of the main substrate. Furthermore, in this case, when the main substrate is relatively thin, its electrostatic short-circuit effect enables the temperature characteristics to be improved.

(Second embodiment)

Figure 3:
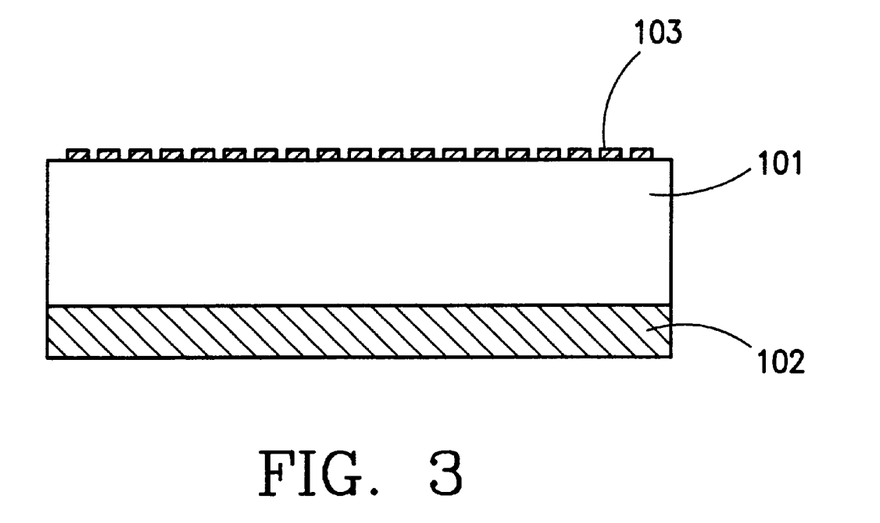
FIG. 3 shows a sectional view of a surface acoustic wave device according to a second embodiment of this invention.

FIG. 3 schematically shows a sectional view of a configuration of a surface acoustic wave device according to a second embodiment of this invention. In FIG. 3, 101 is the main substrate, 102 is the supplementary substrate, and 103 is the comb-like electrode. According to this embodiment, the main substrate 101 comprises an X-cut 112° Y-propagating lithium tantalate of 300 µm thickness, and the supplementary substrate 102 comprises glass of 100 µm thickness. The thickness of the main substrate 101 is set at a sufficiently large value compared to the surface acoustic wavelength. The thermal expansion coefficient is 4 ppm/°C. (the Z direction) for the lithium tantalate substrate and 12 ppm/°C. for the glass substrate. That is, the glass substrate has a smaller thermal expansion coefficient than the main substrate. The configuration of the comb-like electrode 103 is similar to that in the first embodiment.

A method for manufacturing the surface acoustic wave device according to this embodiment is described below with reference to the drawings. Those steps which are not particularly described below are the same as in the first embodiment.

First, as in the first embodiment, the main substrate 101 is directly joined with the supplementary substrate 102. The initially joined substrates are thermally treated in the air to increase the junction strength. Then, a normal photolithography technique is used to form the comb-like electrode 103 on the main-substrate-side surface of the joined body obtained. The surface acoustic wave device according to this embodiment is manufactured through the above process.

Next, the temperature characteristics of the surface acoustic wave device are described. The TCF of the surface acoustic wave device is approximately given as the difference between the TCV of the surface acoustic wave and the thermal expansion coefficient ($\alpha$) of the device substrate as described above. If the main substrate 101 of a small thermal expansion coefficient is directly joined with the supplementary substrate 102 having a smaller thickness and a larger thermal expansion coefficient than the main substrate according to this embodiment, a positive temperature variation causes tensile stress to occur on the main-substrate side of the junction interface, thereby causing the joined body to be warped toward the main substrate. Thus, the combination of the main and supplementary substrates 101 and 102 according to this embodiment provides effects similar to those obtained when the thermal expansion coefficient of the surface acoustic wave substrate of the main substrate is reduced. Thus, the temperature characteristics can be improved as in the first embodiment.

Although this embodiment uses the X-cut 112° Y-propagating lithium tantalate as the main substrate 101, it is not limited to this aspect, and similar effects can be obtained by using a supplementary substrate having a larger thermal expansion coefficient than the main substrate even if a different cut angle is used.

In addition, similar effects can be obtained by using lithium niobate, Langasite, or lithium borate for the main substrate.

Although this embodiment uses glass as the supplementary substrate, it is not limited to this aspect but, for example, the pyroelectricity of the main substrate can be restrained by using a conductor as the supplementary substrate.

As described above, this embodiment provides a surface acoustic wave device having excellent temperature characteristics without changing its characteristics such as the electromechanical coupling coefficient and surface acoustic wave propagation velocity.

(Third embodiment)

Figure 4:
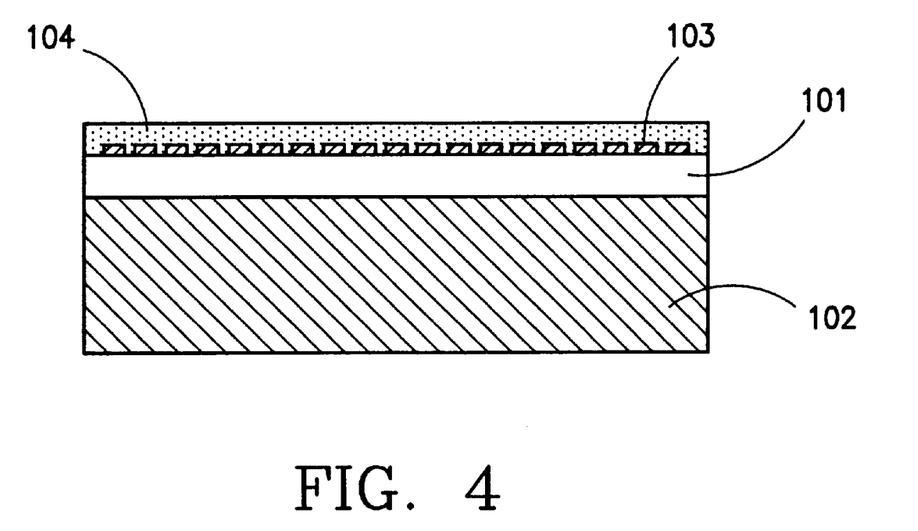
FIG. 4 shows a sectional view of a surface acoustic wave device according to a third embodiment of this invention.

FIG. 4 schematically shows a sectional view of a configuration of a surface acoustic wave device according to a third embodiment of this invention. In FIG. 4, 101 is the main substrate, 102 is the supplementary substrate, 103 is the comb-like electrode, and 104 is a silicon oxide film. According to this embodiment, the main substrate 101 comprises a 41° Y-cut X-propagating lithium niobate of 100 µm thickness, and the supplementary substrate 102 comprises low-thermal-expansion glass of 300 µm thickness. The thickness of the main substrate is set at a sufficiently large value compared to the surface acoustic wavelength. The thermal expansion coefficient is 15.4 ppm/°C. (the surface acoustic wave propagating direction) for the lithium niobate substrate and 4.5 ppm/°C. for the glass substrate. The configuration of the comb-like electrode 103 is similar to that in the first embodiment.

A method for manufacturing the surface acoustic wave device according to this embodiment is described below with reference to the drawings. Those steps which are not particularly described below are the same as in the first embodiment.

First, as in the first embodiment, the main substrate 101 is directly joined with the supplementary substrate 102. Then, the comb-like electrode 103 is formed on one of the main surfaces of the main substrate 101. Finally, sputtering is used to form the silicon oxide film 104 on the main substrate 101 on which the comb-like electrode 103 is formed. The surface acoustic wave device according to this embodiment is manufactured through the above process.

As in the first embodiment, by directly joining the main and supplementary substrates 101 and 102 together, stress caused by the difference in the thermal expansion coefficients of both substrates enables the temperature characteristics of the main substrate to be improved. Besides, since this embodiment forms the silicon oxide film 104 on the main substrate 101, the temperature characteristics can be further improved. The temperature compensation method using a silicon oxide film is well known, but this embodiment provides various piezoelectric characteristics compared to this simple use of the silicon oxide film and enables a substrate of a zero temperature characteristic to be obtained by appropriately selecting the characteristics of the supplementary substrate.

As described above, this embodiment can provide a surface acoustic wave device having not only excellent temperature characteristics but also piezoelectric characteristics different from those of a substrate of the zero temperature coefficient which are conventionally obtained using the silicon oxide film.

Although this embodiment uses the 41° Y-cut X-propagating lithium niobate as the main substrate, it is not limited to this aspect, and similar effects can be obtained by using a supplementary substrate having a smaller thermal expansion coefficient than the main substrate even if a different cut angle is used. In addition, even if the thermal expansion coefficients of both substrates are equivalent in the surface acoustic wave propagating direction, the density variation can be prevented to improve the TCF by setting the thermal expansion coefficient of the supplementary substrate smaller than that of the main substrate in the direction perpendicular to the surface acoustic wave propagating direction. The degree of the improvement, however, is low because only the TCV contributes to this effect. In addition, similar effects can be obtained by using lithium tantalate, Langasite, or lithium borate for the main substrate.

In addition, although this embodiment uses glass as the supplementary substrate, it is not limited to this aspect, and a different low-thermal-expansion material such as silicon may be used. If a conductor is used as the supplementary substrate, it can restrain, for example, the pyroelectricity of the main substrate.

(Fourth embodiment)

Figure 5A:
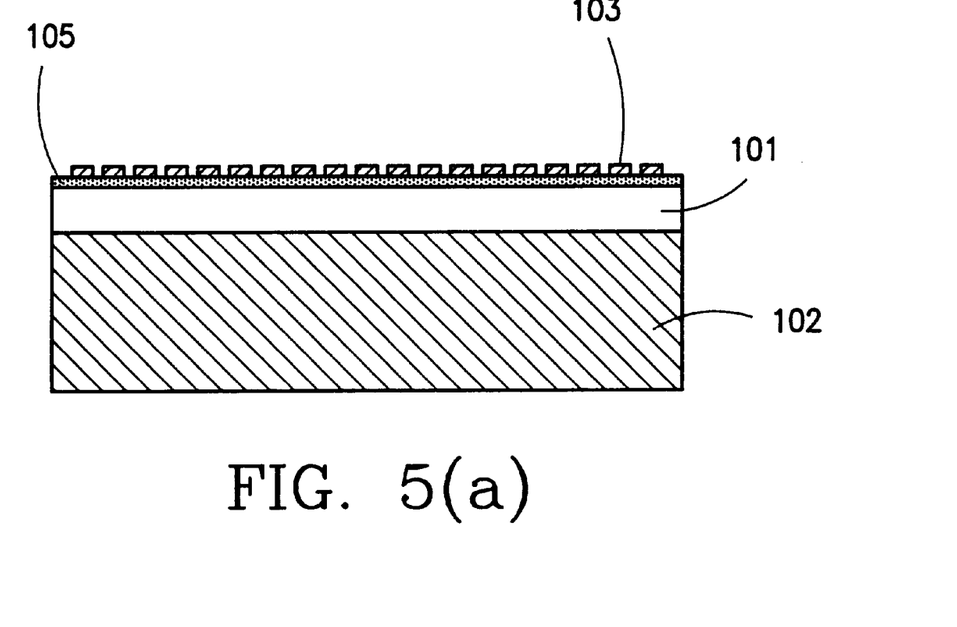
FIGS. 5(a) and 5(b) show sectional views of two surface acoustic wave devices according to a fourth embodiment of this invention.

FIG. 5(a) schematically shows a sectional view of a configuration of a surface acoustic wave device according to a fourth embodiment of this invention. In FIG. 5(a), 101 is the main substrate, 102 is the supplementary substrate, 103 is the comb-like electrode, and 105 is a polarization inverting layer. According to this embodiment, the main substrate 101 comprises a 36° Y-cut X-propagating lithium tantalate of 100 μm thickness, and the supplementary substrate 102 comprises low-thermal-expansion glass of 300 μm thickness. The thickness of the main substrate is set at a sufficiently large value compared to the surface acoustic wavelength. The thermal expansion coefficient is 16 ppm/°C. (the surface acoustic wave propagating direction) for the lithium tantalate substrate and 4.5 ppm/°C. for the glass substrate. The configuration of the comb-like electrode 103 is similar to that in the first embodiment.

A method for manufacturing the surface acoustic wave device according to this embodiment is described below with reference to the drawings. Those steps which are not particularly described below are the same as in the first embodiment.

First, as in the first embodiment, the main substrate 101 is directly joined with the supplementary substrate 102. Then, the polarization inverting layer 105 is formed on the comb-like-electrode 103 side of the main substrate 101. The polarization inverting layer is normally formed through a proton replacement and a thermal treatment processes. According to this embodiment, the thickness of the polarization inverting layer 105 is one-fifth of the surface acoustic wavelength. Finally, a normal photolithography process is used to form the comb-like electrode 103 on the main substrate 101 on which the polarization inverting layer 105 is formed. The surface acoustic wave device according to this embodiment is manufactured through the above process.

As in the first embodiment, by directly joining the main and supplementary substrates 101 and 102 together, stress caused by the difference in the thermal expansion coefficients of both substrates enables the temperature characteristics of the main substrate to be improved. Besides, since this embodiment forms the polarization inverting layer on the main substrate, its electrostatic short-circuit effect enables the temperature characteristics to be further improved. The temperature compensation method using the polarization inverting layer is well known, but this embodiment can further improve the temperature characteristics compared to this simple use of the polarization inverting layer.

As described above, this embodiment can provide a surface acoustic wave device having not only excellent temperature characteristics but also other piezoelectric characteristics different from the conventional ones obtained using the polarization inverting layer.

Although this embodiment uses the 36° Y-cut X-propagating lithium tantalate as the main substrate, it is not limited to this aspect, and similar effects can be obtained by using a supplementary substrate having a smaller thermal expansion coefficient than the main substrate even if a different cut angle is used. In addition, even if the thermal expansion coefficients of both substrates are equivalent in the surface acoustic wave propagating direction, the density variation can be prevented to improve the TCF by setting the thermal expansion coefficient of the supplementary substrate smaller than that of the main substrate in the direction perpendicular to the surface acoustic wave propagating direction. The degree of the improvement, however, is low because only the TCV contributes to this effect. In addition, similar effects can be obtained by using lithium niobate, Langasite, or lithium borate for the main substrate.

In addition, although this embodiment uses glass as the supplementary substrate, it is not limited to this aspect, and a different low-thermal-expansion material such as silicon may be used. If a conductor is used as the supplementary substrate, it can restrain, for example, the pyroelectricity of the main substrate.

Figure 5B:
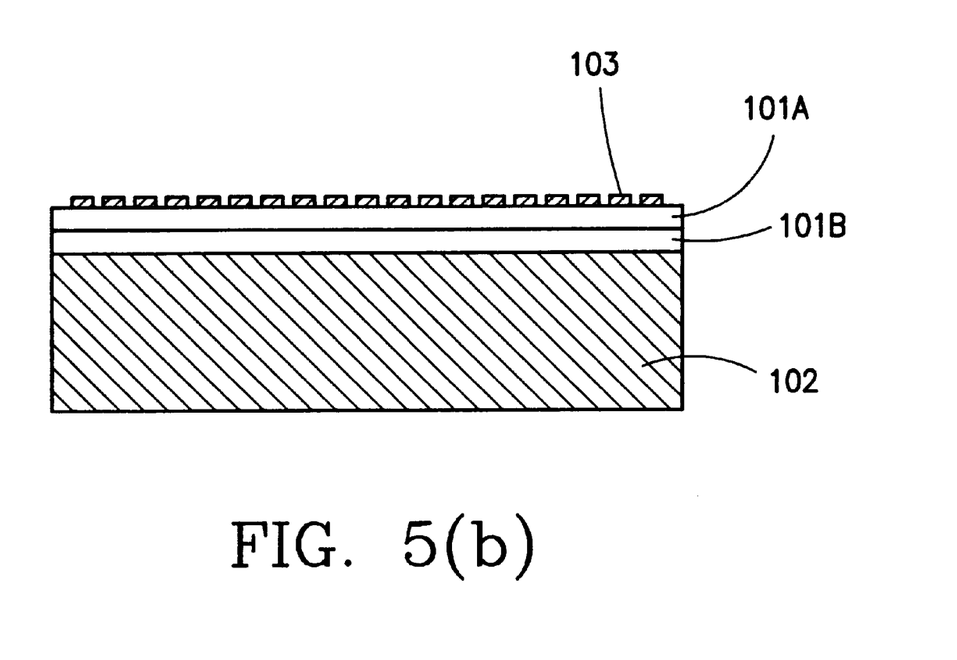

In addition, although this embodiment directly joins the main and supplementary substrates together and then forms the polarization inverting layer, the main substrate on which the polarization inverting layer has already been formed may be directly joined with the supplementary substrate. The polarization-inverting-layer formation method is not limited to this embodiment, and the main substrate may be formed by directly joining together piezoelectric substrates 101A and 101B of different polarizing directions as shown in FIG. 5(b). If the polarization inverting layer is formed using the direct junction, the thickness of the polarization inverting layer can be controlled easily to uniformize the piezoelectric characteristics of the main substrate.

In addition, the thickness of the polarization inverting layer is not particularly limited, and a surface acoustic wave device having various piezoelectric characteristics and excellent temperature characteristics can be obtained by selecting a supplementary substrate depending on the thickness of the polarization inverting layer.

(Fifth embodiment)

Figure 6:
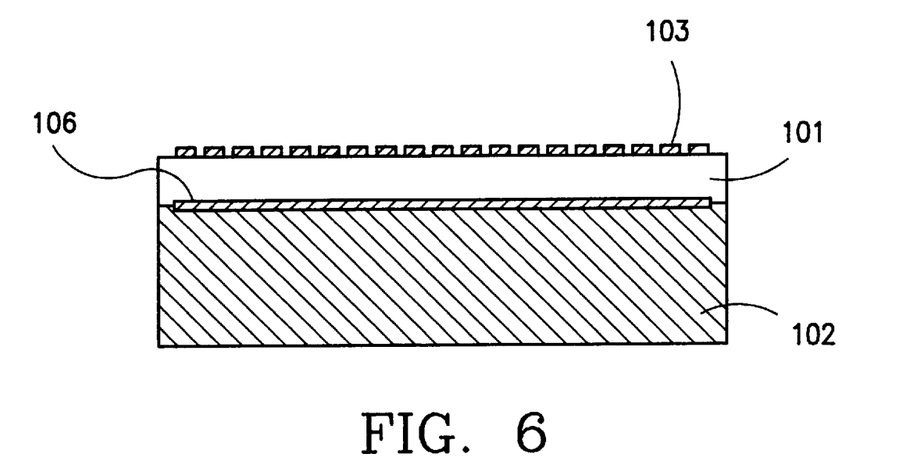
FIG. 6 shows a sectional view of a surface acoustic wave device according to a fifth embodiment of this invention.

FIG. 6 schematically shows a sectional view of a configuration of a surface acoustic wave device according to a fifth embodiment of this invention. In FIG. 6, 101 is the main substrate, 102 is the supplementary substrate, 103 is the comb-like electrode, and 106 is a conductive film. According to this embodiment, the main substrate 101 comprises a 36° Y-cut X-propagating lithium tantalate of 100 μm thickness which has been processed so that its thickness is about one surface acoustic wavelength as is described later, and the supplementary substrate 102 comprises low-thermal-expansion glass of 300 μm thickness. The thermal expansion coefficient is 16 ppm/°C. (the surface acoustic wave propagating direction) for the lithium tantalate substrate and 4.5 ppm/°C. for the glass substrate. The configuration of the comb-like electrode 103 is similar to that in the first embodiment.

A method for manufacturing the surface acoustic wave device according to this embodiment is described below with reference to the drawings. Those steps which are not particularly described below are the same as in the first embodiment.

First, the conductive film 106 is formed on one of the main surfaces of the supplementary substrate 102 in a part corresponding to at least the comb-like electrode 103. According to this embodiment, a several-hundred-Angstrom conductive film 106 is formed of chromium. Then, as in the first embodiment, the main substrate 101 is joined with the supplementary substrate 102 on which the conductive film 106 is formed. In this case, the conductive film 106 and the main substrate 101 are directly joined together. Then, the main substrate 101 is polished until its thickness almost equals one surface acoustic wavelength. Finally, a normal photolithography process is used to form the comb-like electrode 103 on the main substrate 101. The surface acoustic wave device according to this embodiment is manufactured through the above process.

As in the first embodiment, by directly joining the main and supplementary substrates 101 and 102 together, stress caused by the difference in the thermal expansion coefficients of both substrates enables the temperature characteristics of the main substrate to be improved. Besides, since this embodiment forms the conductive film between the main substrate and the supplementary substrate to reduce the thickness of the main substrate, its electrostatic short-circuit effect can be used to further improve the temperature characteristics of the surface acoustic wave device.

As described above, this embodiment can not only provide a surface acoustic wave device having excellent temperature characteristics but also prevent the pyroelectric breakage of the comb-like electrode.

Although this embodiment uses the 36° Y-cut X-propagating lithium tantalate as the main substrate, it is not limited to this aspect, and similar effects can be obtained by using a supplementary substrate having a smaller thermal expansion coefficient than the main substrate even if a different cut angle is used. In addition, even if the thermal expansion coefficients of both substrates are equivalent in the surface acoustic wave propagating direction, the density variation can be prevented to improve the TCF by setting the thermal expansion coefficient of the supplementary substrate smaller than that of the main substrate in the direction perpendicular to the surface acoustic wave propagating direction. The degree of the improvement, however, is low because only the TCV contributes to this effect. In addition, similar effects can be obtained by using lithium niobate, Langasite, or lithium borate for the main substrate.

In addition, although this embodiment uses glass as the supplementary substrate, it is not limited to this aspect, and a different low-thermal-expansion material such as silicon may be used.

In addition, although this embodiment has been described in conjunction with the formation of the conductive film on the supplementary substrate, it is not limited to this aspect, and the conductive film may be formed on the main substrate or both main and supplementary substrates.

Although this embodiment uses chromium as the conductive film, it is not limited to this aspect, and another metal material may be used.

(Sixth embodiment)

Figure 7:
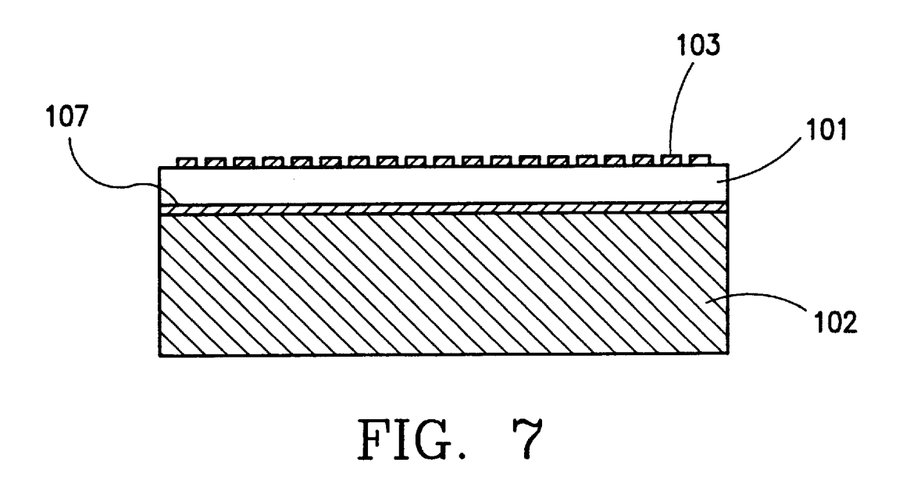
FIG. 7 shows a sectional view of a surface acoustic wave device according to a sixth embodiment of this invention.

FIG. 7 schematically shows a sectional view of a configuration of a surface acoustic wave device according to a sixth embodiment of this invention. In FIG. 7, 101 is the main substrate, 102 is the supplementary substrate, 103 is the comb-like electrode, and 107 is an insulating film. According to this embodiment, the main substrate 101 comprises a 36° Y-cut X-propagating lithium tantalate of 100 $\mu$m thickness, and the supplementary substrate 102 comprises silicon of 300 $\mu$m thickness. The thickness of the main substrate is set at a sufficiently large value compared to the surface acoustic wavelength. The thermal expansion coefficient is 16 ppm/°C. (the surface acoustic wave propagating direction) for the lithium tantalate substrate and 4.5 ppm/°C. for the silicon substrate. The configuration of the comb-like electrode 103 is similar to that in the first embodiment.

A method for manufacturing the surface acoustic wave device according to this embodiment is described below with reference to the drawings. Those steps which are not particularly described below are the same as in the first embodiment.

First, the insulating film 107 is formed on one of the main surfaces of the supplementary substrate 102. According to this embodiment, a sputtering method is used to form a 1000-Angstrom insulating film 107 of silicon oxide. Then, as in the first embodiment, the main substrate 101 is joined with the supplementary substrate 102 on which the insulating film 107 is formed. In this case, the insulating film 107 and the main substrate 101 are directly joined together. Finally, a normal photolithography process is used to form the comb-like electrode 103 on the main substrate 101. The surface acoustic wave device according to this embodiment is manufactured through the above process.

As in the first embodiment, by directly joining the main and supplementary substrates 101 and 102 together, stress caused by the difference in the thermal expansion coefficients of both substrates enables the temperature characteristics of the main substrate to be improved. Besides, since this embodiment forms the insulating film between the main substrate and the supplementary substrate, even a main and a supplementary substrates that cannot be easily combined together due to their compositions can be indirectly joined together.

As described above, this embodiment can provide a surface acoustic wave device having excellent temperature characteristics.

Although this embodiment uses the 36° Y-cut X-propagating lithium tantalate as the main substrate, it is not limited to this aspect, and similar effects can be obtained by using a supplementary substrate having a smaller thermal expansion coefficient than the main substrate even if a different cut angle is used. In addition, even if the thermal expansion coefficients of both substrates are equivalent in the surface acoustic wave propagating direction, the density variation can be prevented to improve the TCF by setting the thermal expansion coefficient of the supplementary substrate smaller than that of the main substrate in the direction perpendicular to the surface acoustic wave propagating direction. The degree of the improvement, however, is low because only the TCV contributes to this effect. In addition, similar effects can be obtained by using lithium niobate, Langasite, or lithium borate for the main substrate.

In addition, although this embodiment uses glass as the supplementary substrate, it is not limited to this aspect, and a different low-thermal-expansion material such as silicon may be used.

In addition, although this embodiment has been described in conjunction with the formation of the insulating film on the supplementary substrate, it is not limited to this aspect, and the insulating film may be formed on the main substrate or both main and supplementary substrates.

Although this embodiment uses silicon oxide as the insulating film, it is not limited to this aspect, and another inorganic film may be used.

(Seventh embodiment)

Figure 8:
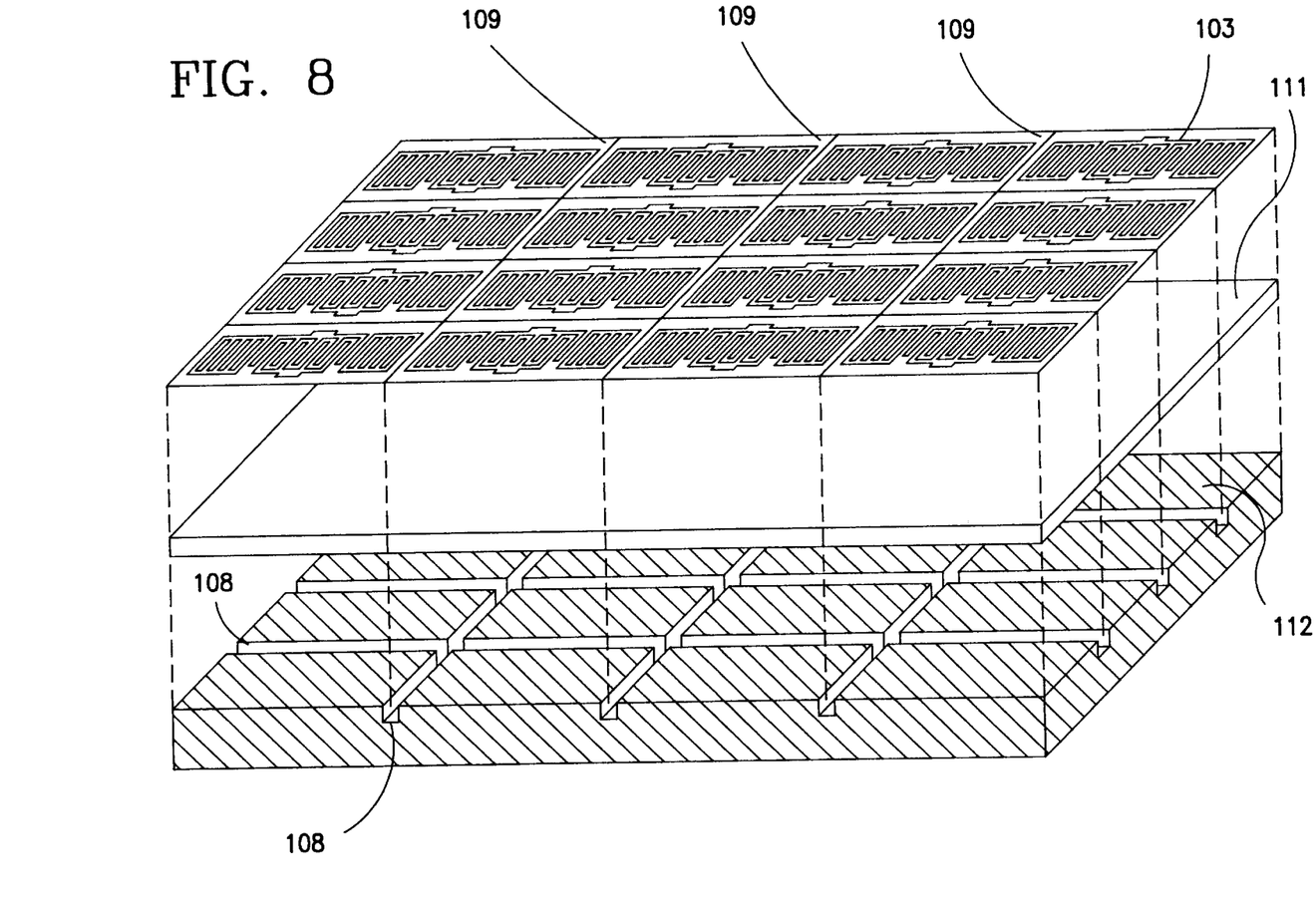
FIG. 8 schematically shows a perspective view of a method for manufacturing a surface acoustic wave device according to a seventh embodiment of this invention.

Next, a seventh embodiment of this invention is described with reference to the drawings. This embodiment relates to a manufacturing method wherein a plurality of surface acoustic wave devices according to this invention are formed on the same substrate material. FIG. 8 schematically shows a perspective view of a method for manufacturing a surface acoustic wave device according to a seventh embodiment of this invention. In FIG. 8, 111 is the main substrate material, 112 is the supplementary substrate material, 103 is the comb-like electrode, 108 is a groove portion, and 109 is a cut line. According to this embodiment, the main substrate material 111 comprises a 36° Y-cut X-propagating lithium tantalate of 100 $\mu$m thickness, and the supplementary substrate material 112 comprises low-thermal-expansion glass of 300 μm thickness. The thickness of the main substrate material 111 is set equal to 10 wavelengths and is thus sufficiently large compared with the surface acoustic wavelength. The thermal expansion coefficient is 16 ppm/°C. (the surface acoustic wave propagating direction) for the lithium tantalate substrate and 4.5 ppm/°C. for the glass substrate.

A method for manufacturing the surface acoustic wave device according to this embodiment is described below with reference to the drawings.

First, a process for directly joining the main and supplementary substrate materials 111 and 112 together. The main and supplementary substrate materials 111 and 112 that have been mirror-finished are prepared. Then, the groove portions 108 are formed on the supplementary substrate material 112 at positions corresponding to the cut lines 109. According to this embodiment, a metallic pattern is formed on the supplementary substrate material 112, which is then etched to form the groove portions 108 therein. Then, both substrate materials are sufficiently washed to remove dust and organic substances therefrom. Both substrate materials are immersed in a mixed solution of ammonium hydroxide and hydrogen peroxide to make their surfaces hydrophilic. This step allows their surfaces to terminate with a hydroxyl group. Then, both substrate materials are rinsed with pure water and placed on their respective main surfaces. Initially, they are mutually joined via water, but the moisture is gradually vaporized and removed to change their junction to one provided by the inter-molecular force of the hydroxyl group and oxygen, thereby firmly joining the main and supplementary substrate materials 111 and 112 together (initial junction). By forming the groove portions 108 in the supplementary substrate material 112 as in this embodiment, the unwanted moisture is removed easily even from the center of the substrate material via the groove portions.

Then, both substrate materials that are initially joined together are thermally treated. Although a certain junction strength can be obtained by leaving the substrate materials under the room temperature, they ate thermally treated at 100° C. or higher for several tens of minutes to several tens of hours in order to increase a junction strength. If there is a large difference between the thermal expansion coefficients of the substrate materials as in this embodiment an upper limit must be set for the thermal treatment temperature depending on the size of both substrate materials (the junction area). This has been described as in Embodiment 1.

In addition, as described above, when substrates of different thermal expansion coefficients are directly joined together, significant stress may occur during thermal treatment to destroy one of the substrate materials. Thus, the groove portions can be provided to reduce the stress in order to enable thermal treatment at higher temperatures, thereby further increasing the junction strength.

Next, a normal photolithography technique is used to form the comb-like electrode 103 on the main-substrate-material-side surface of the joined body obtained. During this process, the substrate materials may warp during a heating process such as the prebaking of a photoresist, so the temperature distribution in the substrate material will be wide if a hot plate is used. Thus, an oven is preferably used during the thermal treatment.

Finally, the substrate material is divided into a plurality of surface acoustic wave devices along the cut lines 109. During this step, the groove portions 109 are removed together with the cut lines 108. Thus, the groove portions are absent from the comb-like electrode portion of each of the individually divided surface acoustic wave devices, so uniform thermal stress acts on the surface acoustic wave devices. Consequently, the plurality of surface acoustic wave devices without the variation of temperature characteristics can be obtained. The surface acoustic wave device according to this embodiment is manufactured via the above process.

As described above, this embodiment provides a surface acoustic wave device having excellent temperature characteristics without changing its characteristics such as the electromechanical coupling coefficient and surface acoustic wave propagation velocity. It also facilitates the evaporation and removal of moisture during the initial junction operation and reduces the stress during the thermal treatment. In addition, the groove portions are absent from the substrate center of each of the individually divided surface acoustic wave devices, so the surface acoustic wave devices can be obtained in which uniform thermal stress occurs despite the variation of temperature, thereby reducing the manufacturing dispersion.

Although this embodiment uses the 36° Y-cut X-propagating lithium tantalate as the main substrate, it is not limited to this aspect but similar effects can be obtained by using a supplementary substrate having a smaller thermal expansion coefficient than the main substrate even if a different cut angle is used. In addition, even if the thermal expansion coefficients of both substrates are equivalent in the surface acoustic wave propagating direction, the density variation can be prevented to improve the TCF by setting the thermal expansion coefficient of the supplementary substrate smaller than that of the main substrate in the direction perpendicular to the surface acoustic wave propagating direction. The degree of the improvement, however, is low because only the TCV contributes to this effect. In addition, similar effects can be obtained by using lithium niobate, Langasite, or lithium borate for the main substrate.

In addition, although this embodiment sets the thickness of the main substrate ten times as large as the surface acoustic wavelength, it is not limited to this aspect but the temperature characteristics of the surface acoustic wave device can be improved without affecting its characteristics as long as the thickness is larger than or equal to about one wavelength in which the particle displacement of the surface acoustic wave concentrates.

In addition, although this embodiment uses glass as the supplementary substrate, it is not limited to this aspect but a different low-thermal-expansion material such as silicon may be used. If glass is used as the supplementary substrate, it can be joined easily with the main monocrystal substrate due to its amorphousness. In addition, the composition of glass enables materials of various mechanical properties to be obtained to allow the temperature characteristics to be controlled easily. If a conductor is used as the supplementary substrate, it can restrain, for example, the pyroelectricity of the main substrate. Furthermore, in this case, when the main substrate is thin, its electrostatic short-circuit effect enables the temperature characteristics to be improved.

In addition, by forming the silicon oxide film on the surface acoustic wave device according to this embodiment, a surface acoustic wave device having excellent temperature characteristics can be obtained which has piezoelectric characteristics different from those of a substrate of the zero temperature coefficient which are conventionally obtained using silicon oxide.

In addition, by forming the polarization inverting layer on the main substrate according to this embodiment, a surface acoustic wave device having excellent temperature characteristics and piezoelectric characteristics different from conventional ones can be obtained as in the use of the silicon oxide film.

As is apparent from the above description, this invention can provide a surface acoustic wave device having excellent temperature characteristics and its manufacturing method without changing the characteristics of the piezoelectric substrate such as the electromechanical coupling coefficient and surface acoustic wave velocity.

In addition, the invention set forth in claim 11 can provide a surface acoustic wave device and its manufacturing method which can help remove moisture while reducing thermal stress during thermal treatment, thereby substantially improving the manufacturing yield.

What is claimed is:

1. A surface acoustic wave devices comprising
   a laminated main substrate formed by directly joining a first piezoelectric monocrystal substrate having a first polarizing direction with a second piezoelectric monocrystal substrate having a second polarizing direction opposite the first polarizing direction;
   a comb-like electrode formed on a first main surface of said main substrate; and
   a supplementary substrate joined to a second main surface of said main substrate, said supplementary substrate having a smaller thermal expansion coefficient and a larger thickness than said main substrate.

2. A surface acoustic wave devices comprising:
   a laminated main substrate formed by directly joining a first piezoelectric monocrystal substrate having a first polarizing direction with a second piezoelectric monocrystal substrate having a second polarizing direction opposite the first polarizing direction;
   a comb-like electrode formed on a first main surface of said main substrate; and
   a supplementary substrate joined to a second main surface of said main substrate, said supplementary substrate having a larger thermal expansion coefficient and a smaller thickness than said main substrate.

3. A surface acoustic wave device according to claim 1, wherein said first main surfaces, including said comb-like electrode, is covered with a film mainly comprising silicon oxide.

4. A surface acoustic wave device according to claim 2, wherein said first main surface, including said comb-like electrode, is covered with a film mainly comprising silicon oxide.

5. A surface acoustic wave device according to claim 1, wherein an insulating film is provided at a junction interface between said main substrate and said supplementary substrate.

6. A surface acoustic wave device according to claim 5, wherein said insulating film is an inorganic film mainly comprising silicon oxide.

7. A surface acoustic wave device according to claim 1, wherein a thickness of said main substrate is larger than one surface acoustic wavelength.

8. A surface acoustic wave device according to claim 1, wherein a conductive film is provided at a junction interface between said main substrate and said supplementary substrate.

9. A surface acoustic wave device according to claim 8, wherein a thickness of said main substrate is almost equal to one surface acoustic wavelength.

10. A surface acoustic wave device according to claim 1, wherein said main substrate is formed from a material selected from the group consisting of lithium tantalate, lithium niobate, Langasite, and lithium borate.

11. A surface acoustic wave device according to claim 1, wherein said supplementary substrate is formed from glass or silicon.

\* \* \* \* \*